United States Patent
Ha et al.

(10) Patent No.: US 10,361,310 B2
(45) Date of Patent: Jul. 23, 2019

(54) METHOD OF FABRICATING SEMICONDUCTOR DEVICES

(71) Applicant: Samsung Electronics Co., Ltd., Suwon-si (KR)

(72) Inventors: Daewon Ha, Seoul (KR); Seungseok Ha, Hwaseong-si (KR); Byoung Hak Hong, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 3 days.

(21) Appl. No.: 15/463,187

(22) Filed: Mar. 20, 2017

(65) Prior Publication Data
US 2018/0040699 A1   Feb. 8, 2018

(30) Foreign Application Priority Data
Aug. 5, 2016   (KR) .......................... 10-2016-0100036

(51) Int. Cl.
*H01L 29/41* (2006.01)
*H01L 29/78* (2006.01)
*H01L 29/66* (2006.01)

(52) U.S. Cl.
CPC .... *H01L 29/7851* (2013.01); *H01L 29/66545* (2013.01); *H01L 29/66795* (2013.01); *H01L 29/785* (2013.01); *H01L 29/7848* (2013.01)

(58) Field of Classification Search
CPC ......... H01L 2029/7858; H01L 29/7855–7856; H01L 29/41791; H01L 21/823431; H01L 21/823821; H01L 21/845; H01L 27/0886; H01L 27/0924; H01L 27/10826; H01L 27/10879; H01L 27/1211; H01L 2924/13067; H01L 29/04–045; H01L 29/16–1608; H01L 29/18–185; H01L 29/22–2206
USPC ........ 438/136, 137, 455–458, 149–165, 173, 438/192, 206, 212, 424, 427, 428, 591
See application file for complete search history.

(56) References Cited

U.S. PATENT DOCUMENTS

| | | |
|---|---|---|
| 4,700,136 A | 10/1987 | Nair |
| 4,700,316 A | 10/1987 | Nair |
| 6,812,149 B1 | 11/2004 | Wang et al. |

(Continued)

FOREIGN PATENT DOCUMENTS

| | | |
|---|---|---|
| JP | 2016-508669 A | 3/2016 |
| KR | 10-1316959 B1 | 10/2013 |

OTHER PUBLICATIONS

"GT10—Silicon Diffusivity Data," Theory of Fabrication of Integrated Circuits (ece444), University of Illinois at Urbana-Champaign, http://fabweb.ece.illinois.edu/gt/gt/gt10.aspx, accessed Jul. 13, 2018 (1 page).

*Primary Examiner* — Moin M Rahman
(74) *Attorney, Agent, or Firm* — Muir Patent Law, PLLC

(57) ABSTRACT

A method of fabricating a semiconductor device includes patterning a substrate to form an active fin, forming a sacrificial gate pattern crossing over the active fin on the substrate, removing the sacrificial gate pattern to form a gap region exposing the active fin, and forming a separation region in the active fin exposed by the gap region. Forming the separation region includes forming an oxide layer in the exposed active fin and forming an impurity regions with impurities implanted into the exposed active fin.

18 Claims, 19 Drawing Sheets

(56) References Cited

U.S. PATENT DOCUMENTS

| | | |
|---|---|---|
| 7,101,763 B1 | 9/2006 | Anderson et al. |
| 7,681,164 B2 | 3/2010 | Lin et al. |
| 7,824,983 B2 | 11/2010 | Juengling |
| 8,609,510 B1 | 12/2013 | Banna et al. |
| 8,846,491 B1 | 9/2014 | Pham et al. |
| 9,136,343 B2 | 9/2015 | Pillarisetty et al. |
| 2009/0294840 A1* | 12/2009 | Gilgen ............ H01L 21/823431 257/327 |
| 2015/0008524 A1 | 1/2015 | Hung et al. |
| 2015/0255456 A1 | 9/2015 | Jacob et al. |

* cited by examiner

METHOD OF FABRICATING SEMICONDUCTOR DEVICES

CROSS-REFERENCE TO RELATED APPLICATION

This U.S. non-provisional patent application claims priority under 35 U.S.C. § 119 to Korean Patent Application No. 10-2016-0100036, filed on Aug. 5, 2016, in the Korean Intellectual Property Office, the disclosure of which is incorporated herein in its entirety by reference.

BACKGROUND

Example embodiments relate to a method of fabricating a semiconductor device, and more particularly, to a method of fabricating a semiconductor device including fin field-effect transistors (FINFETs).

A semiconductor device may include integrated circuits (ICs) including metal-oxide-semiconductor field-effect transistors (MOS-FETs). As the size and design rule of such semiconductor devices decrease, the MOS-FETs are being increasingly scaled down. The reduction in size of the MOS-FET may lead to deterioration in operational properties of the semiconductor device. A variety of studies are being conducted to overcome technical limitations associated with the scaling-down of semiconductor devices and to realize high performance of semiconductor devices.

SUMMARY

Example embodiments can provide methods of fabricating a semiconductor device capable of improving electrical characteristics.

In some embodiments, the disclosure is directed to a method of fabricating a semiconductor device, the method comprising: patterning a substrate to form an active fin; forming a sacrificial gate pattern crossing over the active fin on the substrate; removing the sacrificial gate pattern to form a gap region exposing the active fin; and forming a separation region in the active fin exposed by the gap region, wherein forming the separation region comprises forming an oxide layer in the exposed active fin and forming an impurity region with impurities implanted into the exposed active fin.

In some embodiments, the disclosure is directed to a method of fabricating a semiconductor device, the method comprising: forming an active fin extending in a first direction on a substrate; forming a first sacrificial gate pattern, a second sacrificial gate pattern and a third sacrificial gate pattern covering the active fin and being spaced apart from one another in a second direction perpendicular to the first direction on the substrate; removing the first, second and third sacrificial gate patterns to form a first gap region, a second gap region and a third gap region exposing portions of the active fin; forming an oxide layer in only a portion of the active fin that is exposed by the second gap region, wherein the second gap region is disposed between the first and third gap regions; and forming a first gate pattern, a second gate pattern and a third gate pattern filling the first, second and third gap regions, respectively.

In some embodiments, the disclosure is directed to a method of fabricating a semiconductor device, the method comprising: patterning a substrate to form an active fin that protrudes from a surface of the substrate; forming a first sacrificial gate pattern, a second sacrificial gate pattern and a third sacrificial gate pattern covering the active fin and being spaced apart from one another in a second direction perpendicular to the first direction on the substrate; removing the first, second and third sacrificial gate patterns to form a first gap region, a second gap region and a third gap region exposing portions of the active fin; and forming an isolation region in a portion of the active fin exposed by the second gap region, wherein forming the isolation region comprises forming an oxide layer in the portion of the active fin exposed by the second gap region.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

The use of similar or identical reference numbers in the various drawings is intended to indicate the presence of a similar or identical element or feature.

DETAILED DESCRIPTION

Figure 1A:
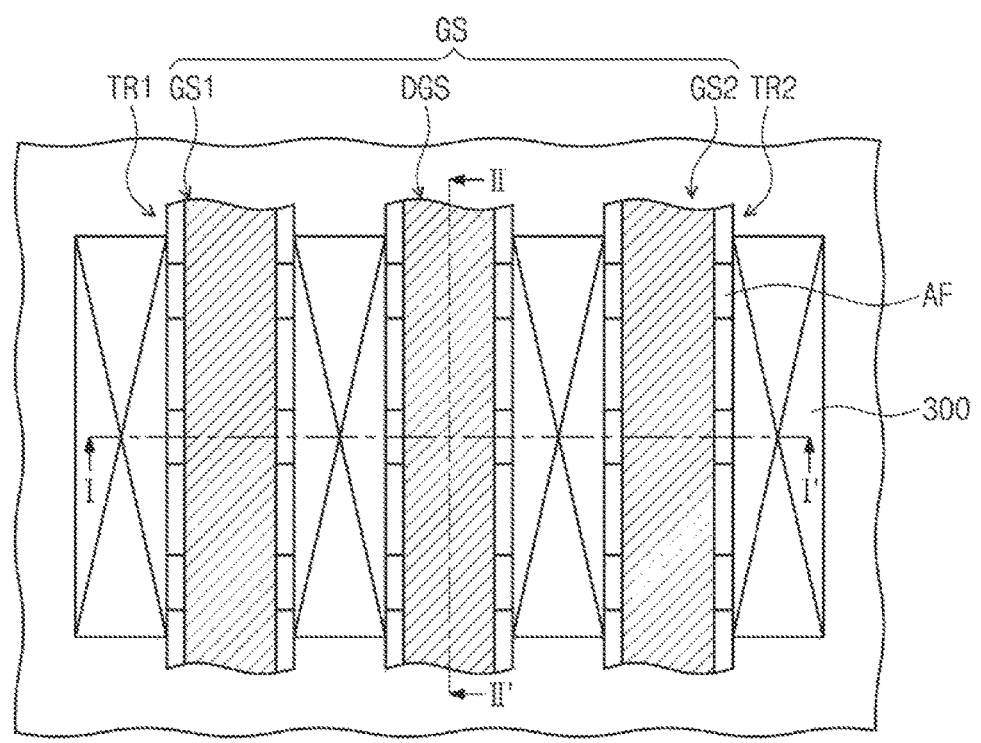
FIG. 1A is a plan view illustrating a semiconductor device according to example embodiments.

Example embodiments will now be described more fully with reference to the accompanying drawings, in which example embodiments are shown. As used herein, the terms "material continuity" and "materially in continuity" may refer to structures, patterns, and/or layers that are formed at the same time and of the same material, without a break in the continuity of the material of which they are formed. As one example, structures, patterns, and/or layers that are in "material continuity" or "materially in continuity" may be homogeneous monolithic structures.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes.

A dummy gate, or a dummy gate structure, may be a conductive line or electrode formed at the same level and adjacent to normal gate lines or electrodes (e.g., normal word lines). A dummy gate may be patterned from the same conductive layer(s) forming such normal word lines. For example, a dummy gate may be simultaneously formed with normal gate lines with the same processes that deposit and pattern the conductive layer(s) forming normal word lines. Dummy gate lines in memory devices are not effective to cause transmission of data to external devices. For instance, a dummy gate line may not be electrically connected to gates of memory cells, or if a dummy gate line is electrically connected to gates of dummy memory cells, such dummy gate lines may not be activated or if activated, may not result in communication of any data in such dummy memory cells to a source external to the memory device.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Figure 1B:
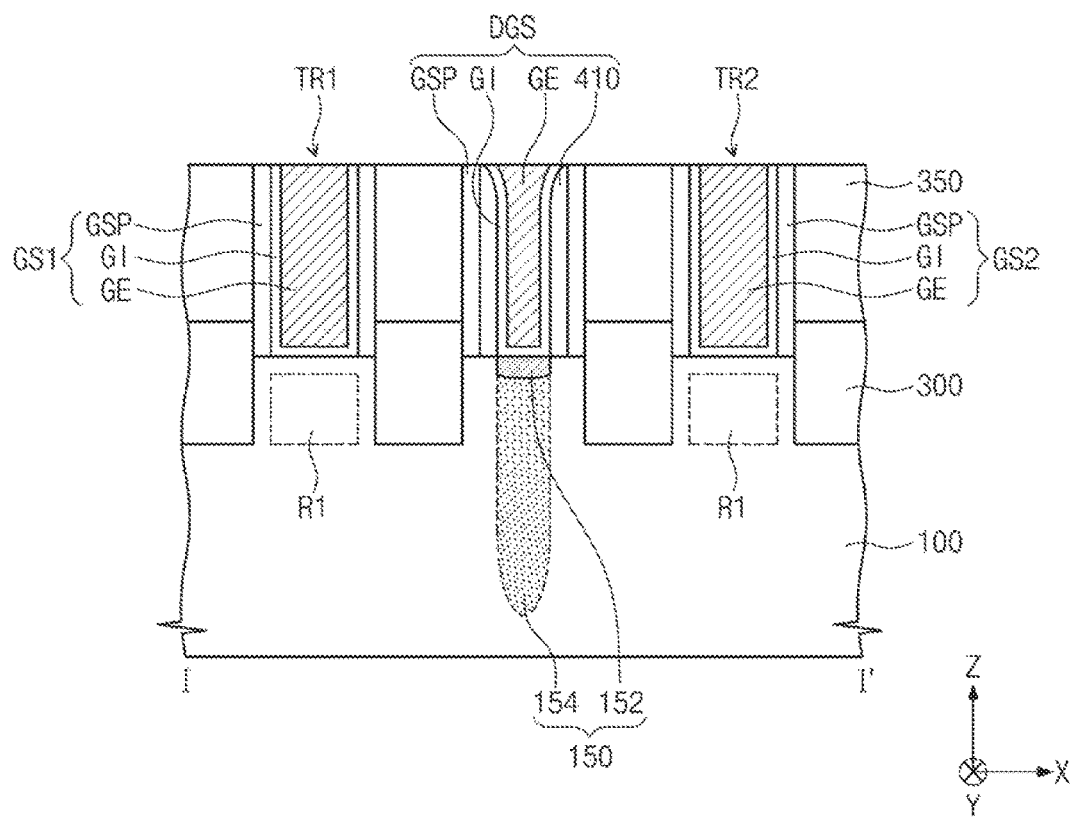
FIG. 1B is a cross-sectional view taken along line I-I' of FIG. 1A.
Figure 1C:
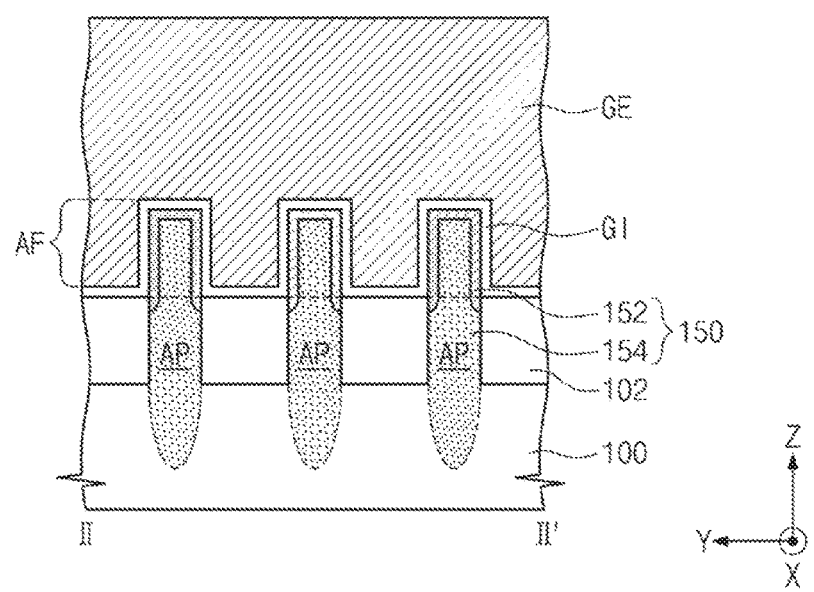
FIG. 1C is a cross-sectional view taken along line II-II' of FIG. 1A.

FIG. 1A is a plan view illustrating a semiconductor device according to example embodiments. FIG. 1B is a cross-sectional view taken along line I-I' of FIG. 1A. FIG. 1C is a cross-sectional view taken along line II-II' of FIG. 1A.

Referring to FIGS. 1A to 1C, active patterns AP and gate structures GS crossing over the active patterns AP may be provided on a substrate 100. The substrate 100 may be a semiconductor substrate. For example, the substrate 100 may be a bulk silicon wafer or a silicon-on-insulator (SOI) wafer. Each of the active patterns AP may have a shape extending in a direction. For the sake of convenient description, the description that follows will refer to an example in which each of the active patterns AP extends in a first direction X. Hereinafter, a second direction Y is defined as a direction perpendicular to the first direction X, and a third direction Z is defined as a direction perpendicular to both of the first and second directions X and Y. Each of the active patterns AP may protrude from the substrate 100 in the third direction Z. For example, they may protrude from a top surface of the substrate 100. It should be noted that in some embodiments, the active patterns AP may be part of the substrate, and in this manner, protruding from the substrate refers to protruding past a top surface of the substrate (e.g., wherein the substrate itself has protrusions that extend beyond a main surface thereof).

Each of device isolation patterns 102 may cover a portion of sidewall of the active pattern AP. For example, the device isolation patterns 102 may be provided to expose an upper portion of each of the active pattern AP. The upper portion of the active pattern AP exposed by the device isolation pattern 102 may be defined as an active fin AF. For example, the active fin AF may be the portion of the active pattern AP that protrudes from the substrate 100 and extends above a top surface of the device isolation pattern 102 in the Z direction, having a vertical level that is higher than the top surface of the device isolation pattern 102. In some embodiments, the active fin AF may extend higher than an uppermost horizontal surface of the device isolation pattern 102. The active fin AF and the active pattern AP may constitute one body without an interface therebetween. For example, the active fin AF may be in material continuity with the active pattern AP. In addition, the active fin AF and active pattern AP may be in material continuity with the main body of the substrate 100.

A plurality of gate structures GS may be provided to extend in the second direction Y and to be spaced apart from one another in the first direction X. The gate structures GS may include a first gate structure GS1, a second gate structure GS2, and a dummy gate structure DGS interposed between the first and second gate structures GS1 and GS2. In some embodiments, the dummy gate structure DGS is not electrically connected to the first gate structure GS1 or the second gate structure GS2.

The first gate structure GS1 may cross over the active pattern AP and cover a top surface and both sidewalls of the active fin AF. The active fin AF may be located below the first gate structure GS1. The active fin AF may include a channel region R1. The first gate structure GS1 may include a gate electrode GE crossing over the active pattern AP, a gate spacer GSP disposed on sidewall of the gate electrode GE, and a gate dielectric pattern GI interposed between the gate electrode GE and the gate spacer GSP. A portion of the gate dielectric pattern GI may extend below a bottom surface of the gate electrode GE, and above the channel region R1. The gate electrode GE may be formed of or include a conductive material including at least one of conductive metal nitrides (e.g., titanium nitride, tantalum nitride, etc.), and metals (e.g., aluminum, tungsten, etc.). The gate dielectric pattern GI may include at least one of high-k dielectric materials. For example, the gate dielectric pattern GI may be formed of or include at least one of hafnium oxide, hafnium silicate, zirconium oxide and zirconium silicate, but the inventive concepts is not limited thereto. The gate spacer GSP may be formed of or include a nitride (e.g., silicon nitride). The second gate structure GS2 has substantially the same material and structure as the first gate structure GS1, and therefore a merely duplicated description will be omitted for the sake of simplicity.

The dummy gate structure DGS may cross over the active pattern AP and cover a top surface and both sidewalls of the active fin AF. The active fin AF may be located below the dummy gate structure DGS. The active fin AF may include a separation region 150. In some embodiments, the separation regions 150 may be formed discontinuously along a dummy gate structure DGS. For example, a separation region 150 may be formed at each intersection of the active fins AF and the dummy gate structure DGS, providing localized separation regions 150 between adjacent transistors formed along the same active fin AF, electrically isolating the adjacent transistors and preventing current leakage between the adjacent transistors (e.g., between source/drain regions of neighboring transistors).

The separation region 150 may include an oxide layer 152 and an impurity region 154. Referring to FIG. 1B, the oxide layer 152 may be formed in a surface of the active fin AF and the impurity region 154 may be formed below the oxide layer 152. However, when a width of the active fin AF is fine or small, the oxide layer 152 may be formed not only in a surface, but also in a whole interior of the active fin AF. A lowermost surface of the impurity region 154 may be formed deeper toward an interior of the substrate 100 (e.g., extending in the direction of a bottom surface of the substrate 100) than a bottom surface of the oxide layer 152. For example, a vertical level of a lowermost surface of the impurity region 154 may be lower than a vertical level of a lowermost surface of the source/drain region 300.

The dummy gate structure DGS may include a gate electrode GE, gate spacers GSP, a gate dielectric pattern GI interposed between the gate electrode GE and the gate spacer GSP, and a barrier spacer 410 interposed between the gate dielectric pattern GI and the gate spacer GSP. The gate dielectric pattern GI may extend below a bottom surface of the gate electrode GE. For example, the gate dielectric pattern GI may be interposed between the gate electrode GE and the device isolation pattern 102. The gate electrode GE, the gate dielectric pattern GI and the gate spacer GSP of the dummy gate structure DGS may be of the same or similar material as the gate electrode GE, the gate dielectric pattern GI and the gate spacer GSP of the first gate structure GS1, respectively. The barrier spacer 410 may be formed along the gate spacer GSP. The barrier spacer 410 may include, for example, silicon nitride or silicon oxide. Due to the presence of the barrier spacer 410, the gate electrode GE of the dummy gate structure DGS may have a width narrower than that of the gate electrode GE of the first gate structure GS1. In some embodiments, a width of the dummy gate structure DGS, which includes a gate electrode GE, may be substantially the same as a width of the first gate structure GS1, which includes a gate electrode GE, but the widths of the respective gate electrodes GE may be different.

The source/drain region 300 may include an epitaxial pattern grown using the active pattern AP as a seed layer. The source/drain region 300 may include at least one of silicon germanium (SiGe), silicon (Si), and silicon carbide (SiC).

According to an embodiment, the first gate structure GS1, the channel region R1 disposed below the first gate structure GS1, and the source/drain region 300 disposed at both sides of the first gate structure GS1 may constitute a first transistor TR1, and the second gate structure GS2, the channel region R1 disposed below the second gate structure GS2, and the source/drain region 300 disposed at both sides of the second gate structure GS2 may constitute a second transistor TR2. The first transistor TR1 and the second transistor TR2 may be electrically separated from each other by the separation region 150 formed therebetween, insulating the first and second transistors TR1 and TR2 from one another. For example, the separation region 150 may provide a localized junction isolation region between adjacent first and second transistors TR1 and TR2.

A lower interlayer insulating layer 350 may be provided on the substrate 100 to cover both sidewalls of each of the gate structures GS and source/drain regions 300. The lower interlayer insulating layer 350 may include at least one of a silicon oxide layer, a silicon nitride layer, a silicon oxynitride layer or a low-k dielectric layer.

According to an embodiment, an upper interlayer insulating layer (not illustrated) may further provided on the substrate 100. For example, the upper interlayer insulating layer may be provided above the lower interlayer insulating layer 350. The upper interlayer insulating layer may include oxides, nitrides and/or oxynitrides. Contact holes may be formed to penetrate the upper interlayer insulating layer and the lower interlayer insulating layer 350, and then, the source/drain regions 300 may be exposed by the contact holes. Contact plugs may be formed to fill the contact holes, respectively. Interconnection lines (not illustrated) may be formed on the upper interlayer insulating layer. The interconnection lines may be electrically connected to the source/drain lines 300 through the contact plugs, respectively. The contact plug and the interconnection line may include conductive materials.

Figure 2:
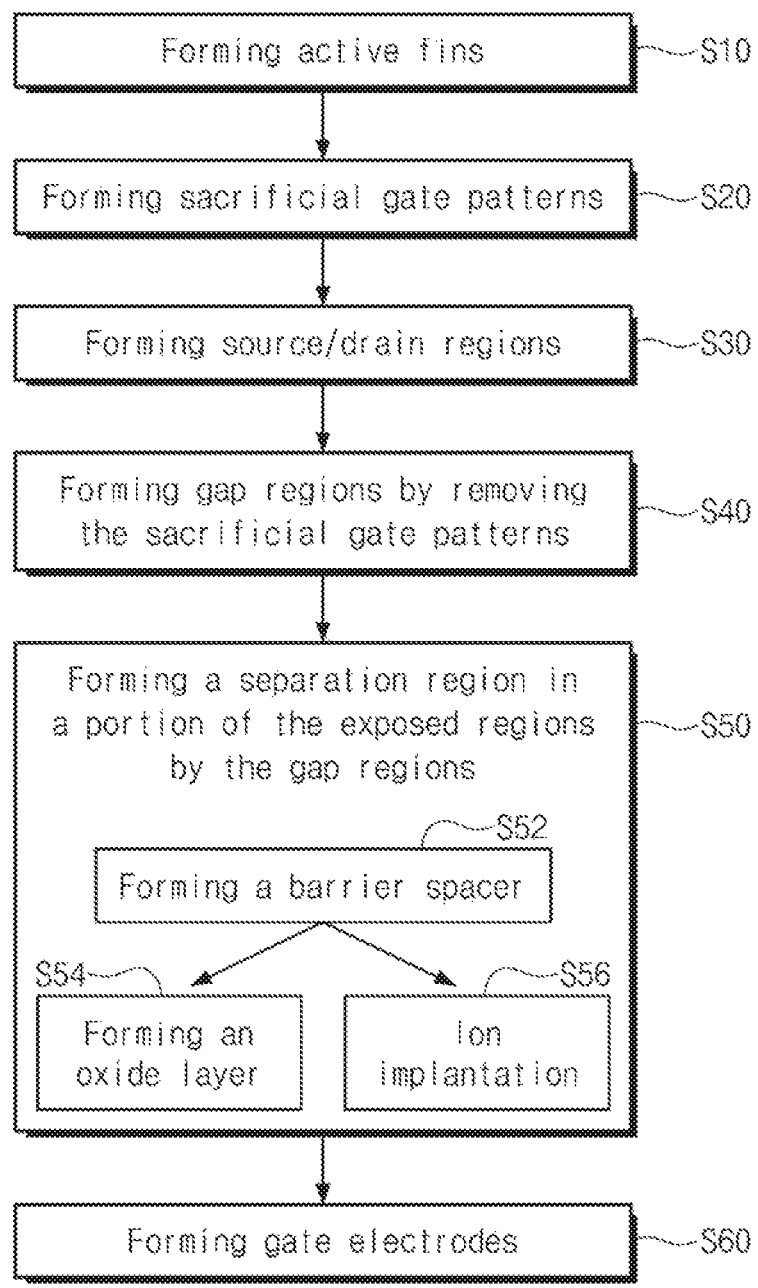
FIG. 2 is a flowchart illustrating a method of fabricating a semiconductor device according to example embodiments.

FIG. 2 is a flowchart illustrating a method of fabricating a semiconductor device according to example embodiments. FIGS. 3A to 9A are plan views illustrating a method of fabricating a semiconductor device according to example embodiments. FIGS. 3B to 9B are cross-sectional views taken respectively along line I-I' of FIGS. 3A to 9A. FIGS. 3C to 9C are cross-sectional views taken respectively along line II-II' of FIGS. 3A to 9A.

Figure 3A:
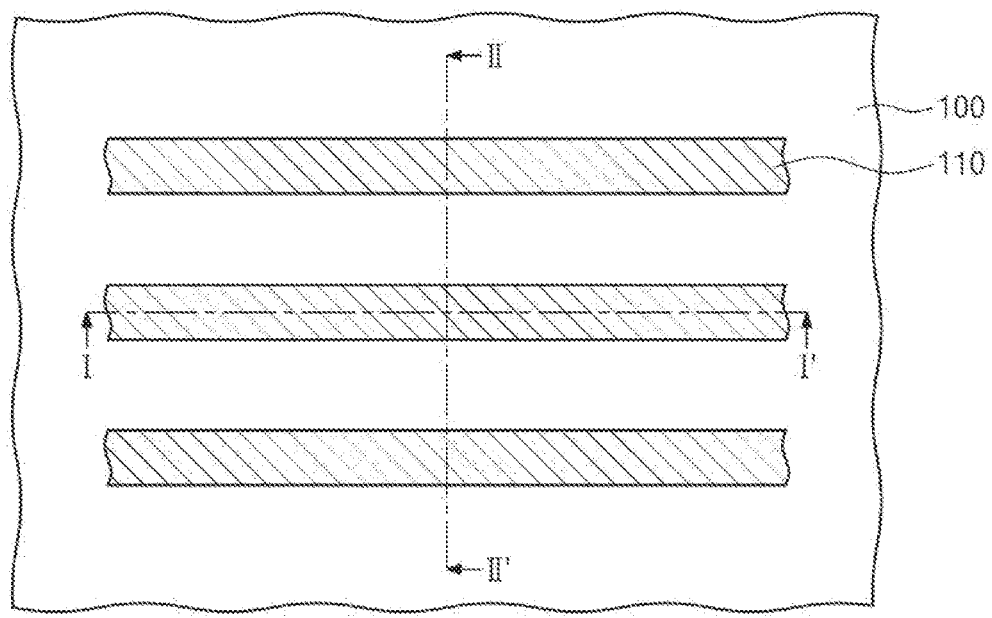
FIGS. 3A, 4A, 5A, 6A, 7A, 8A, and 9A are plan views illustrating a method of fabricating a semiconductor device according to example embodiments.
Figure 3B:
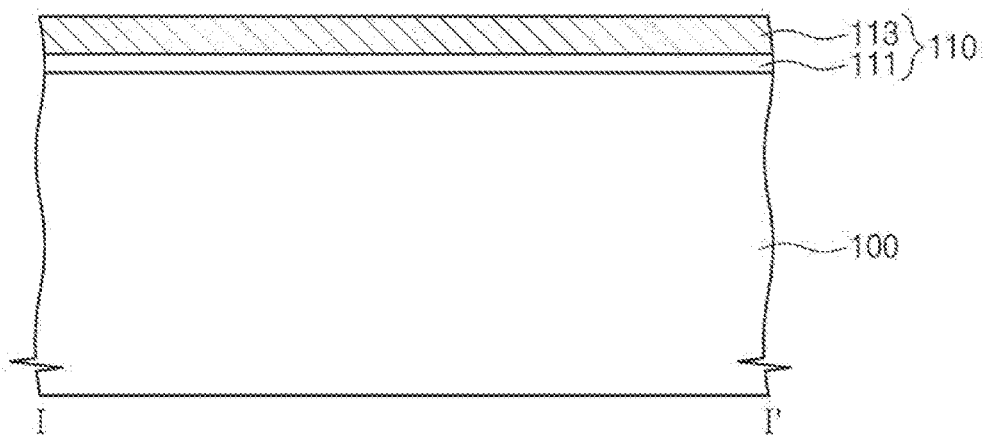
FIGS. 3B, 4B, 5B, 6B, 7B, 8B, and 9B are cross-sectional views taken along line I-I' of FIGS. 3A, 4A, 5A, 6A, 7A, 8A, and 9A, respectively.
Figure 3C:
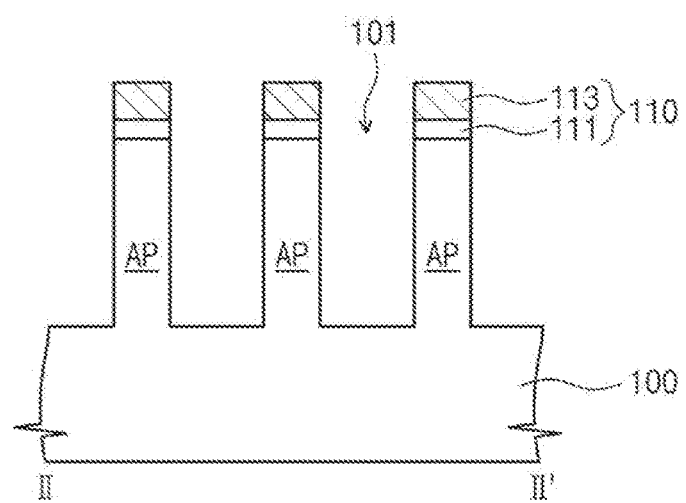
FIGS. 3C, 4C, 5C, 6C, 7C, 8C, and 9C are cross-sectional views taken along line II-II' of FIGS. 3A, 4A, 5A, 6A, 7A, 8A, and 9A, respectively.
Figure 4A:
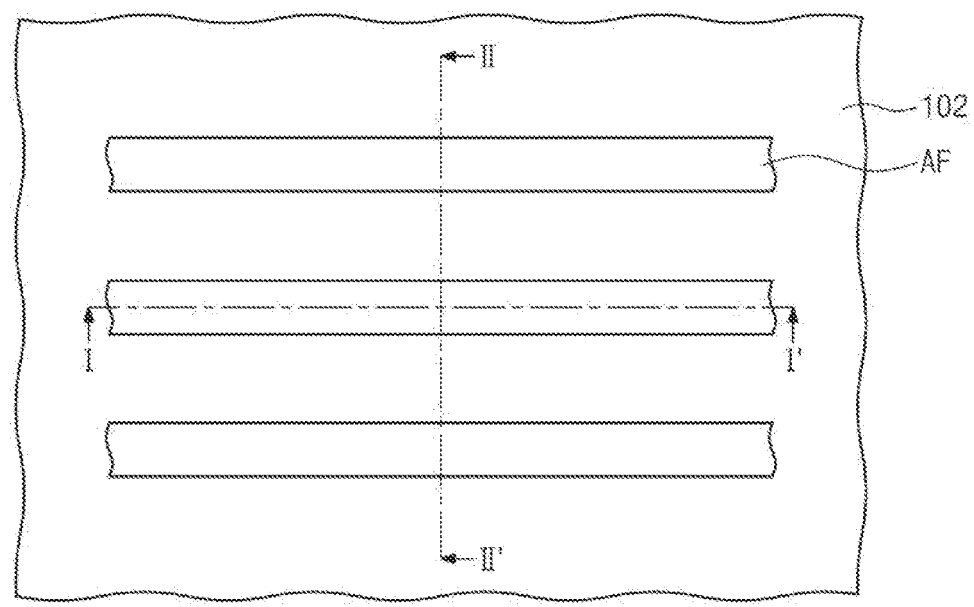
Figure 4B:
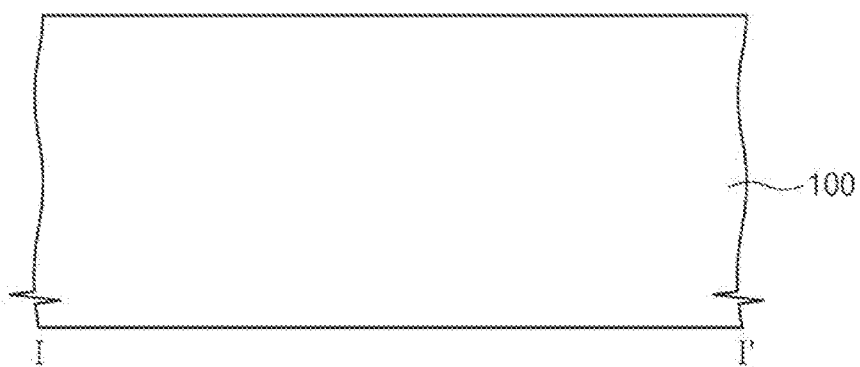
Figure 4C:
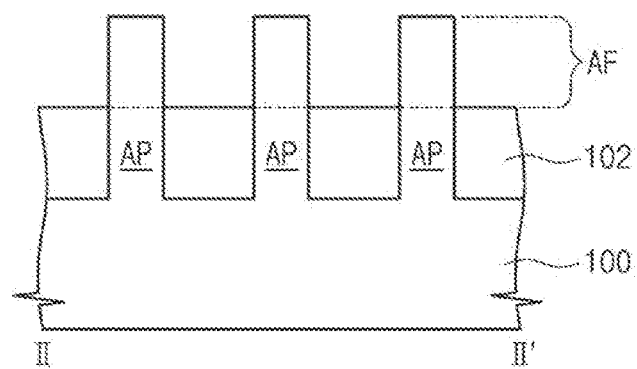
Figure 5A:
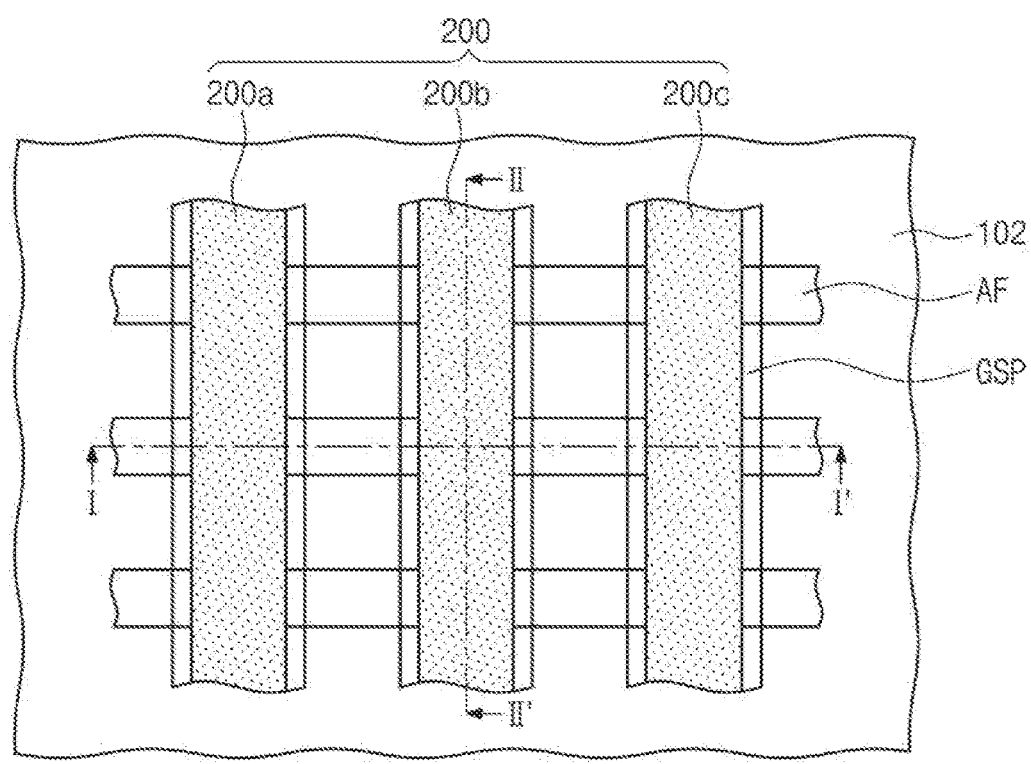
Figure 5B:
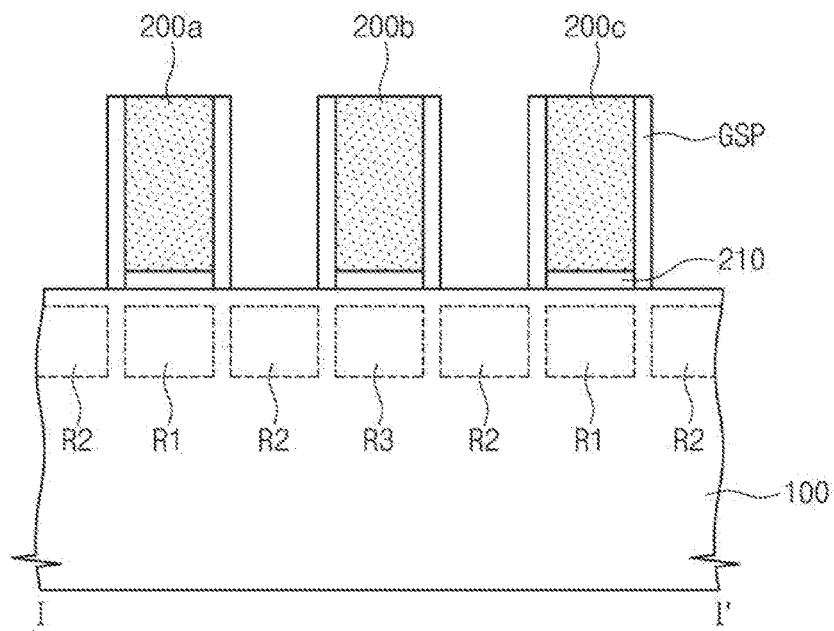
Figure 5C:
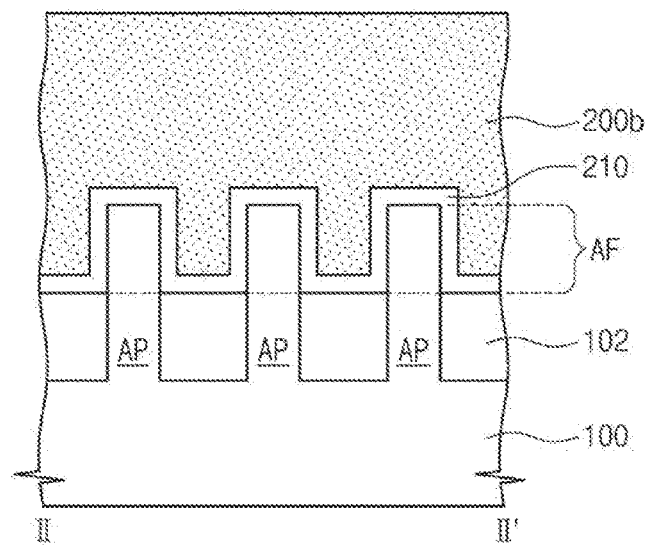
Figure 6A:
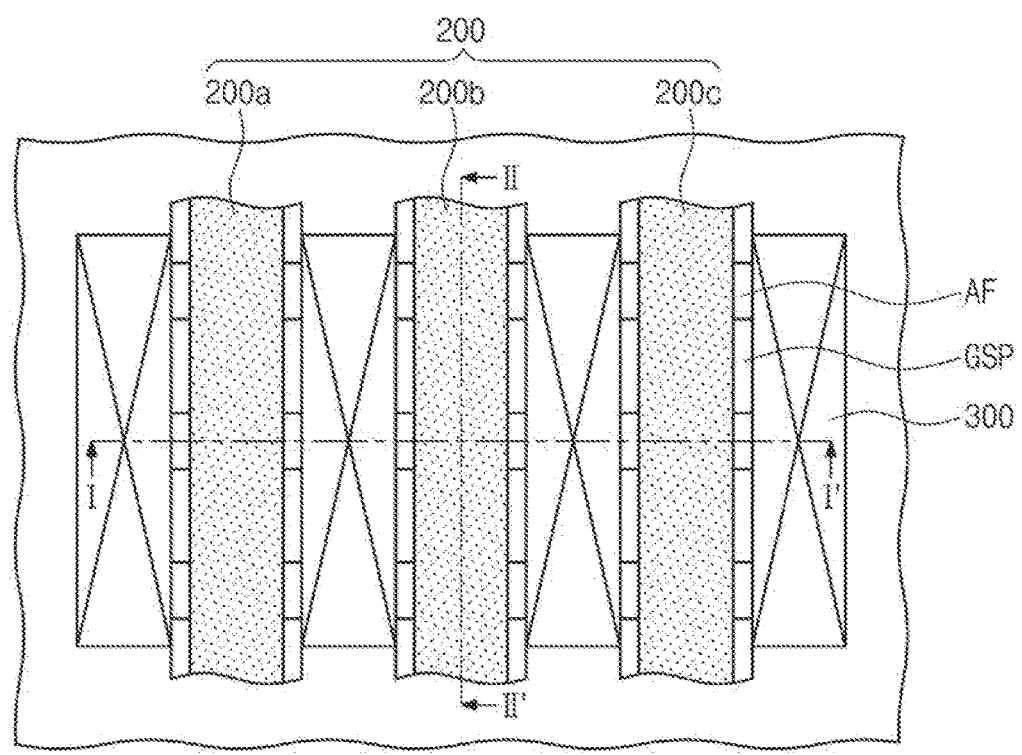
Figure 6B:
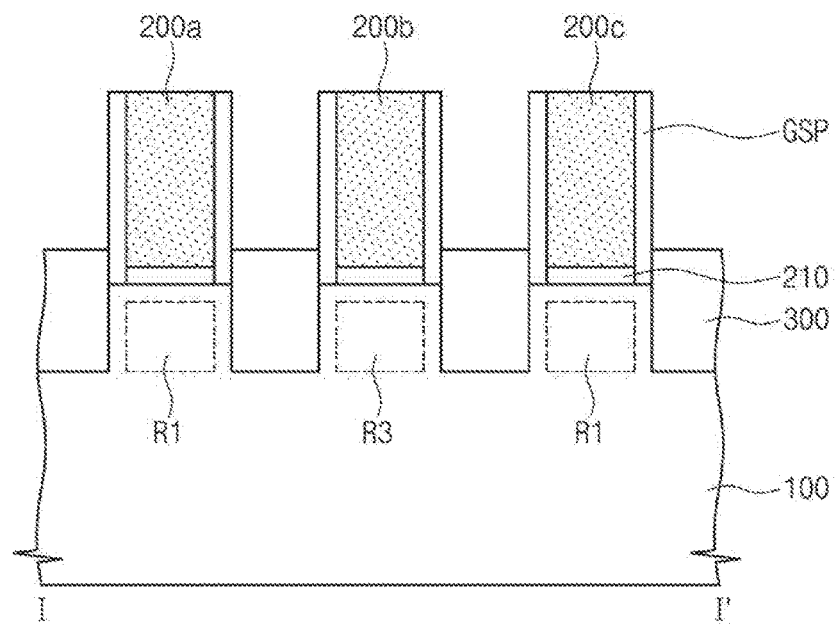
Figure 6C:
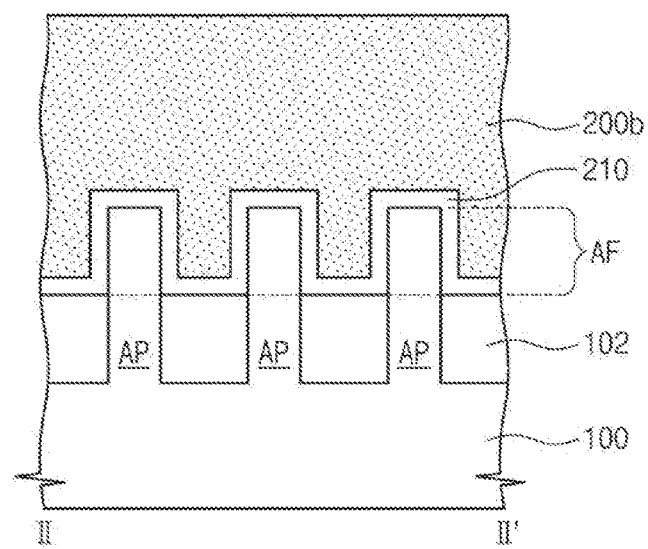
Figure 7A:
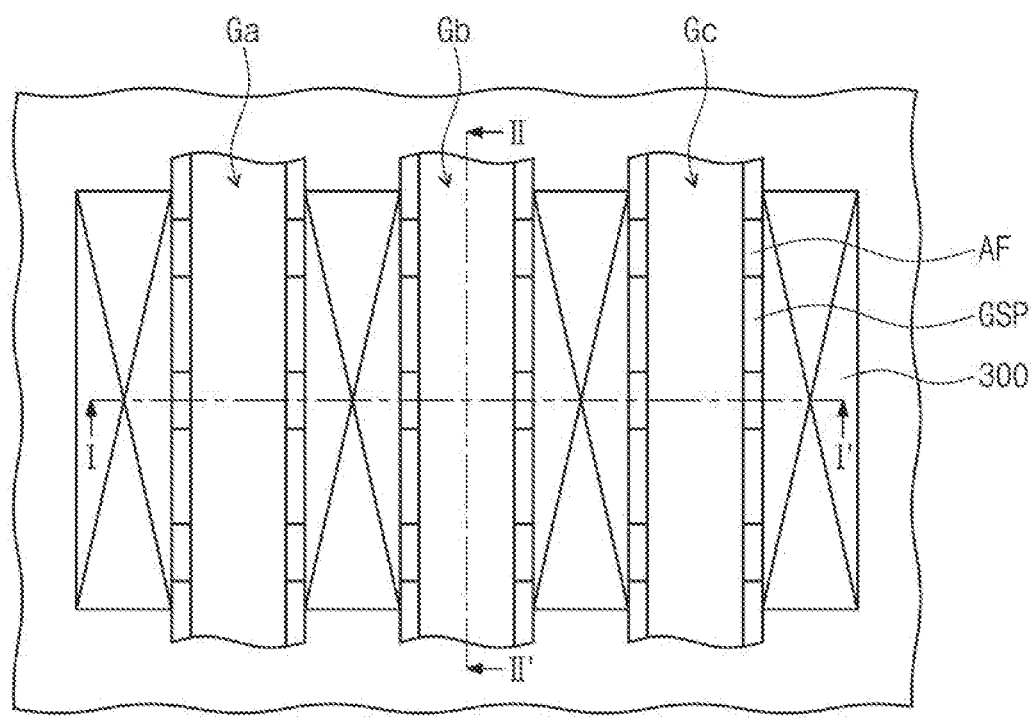
Figure 7B:
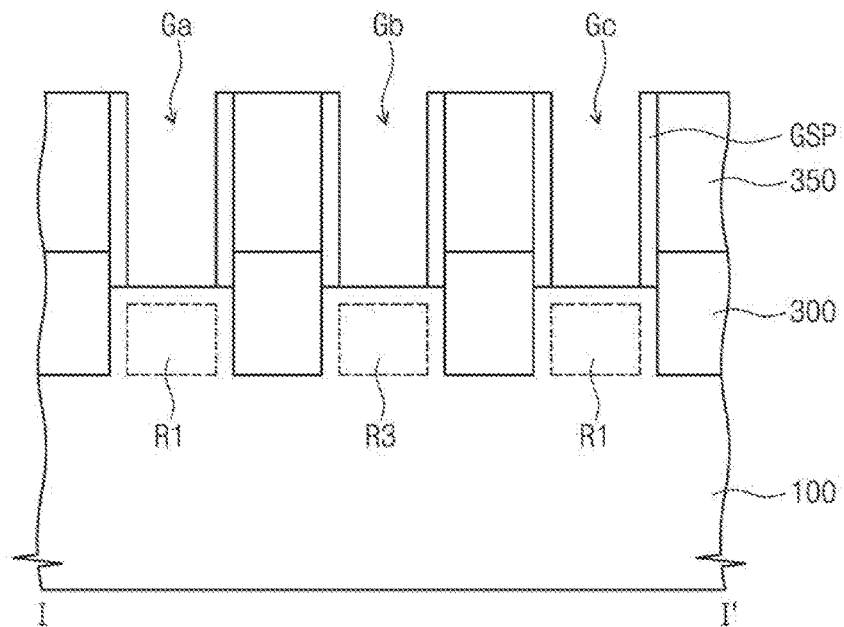
Figure 7C:
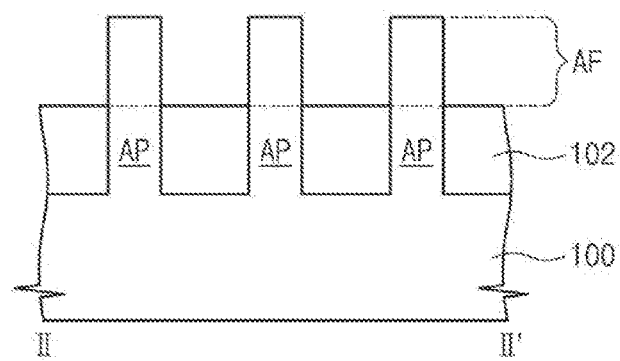
Figure 8A:
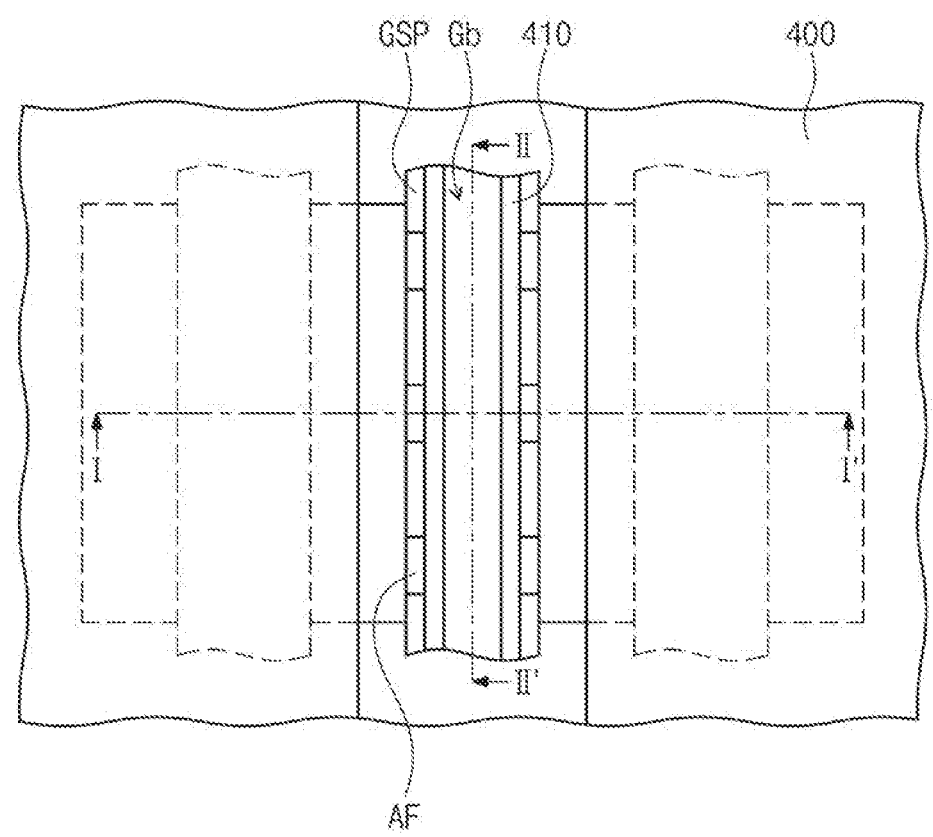
Figure 8B:
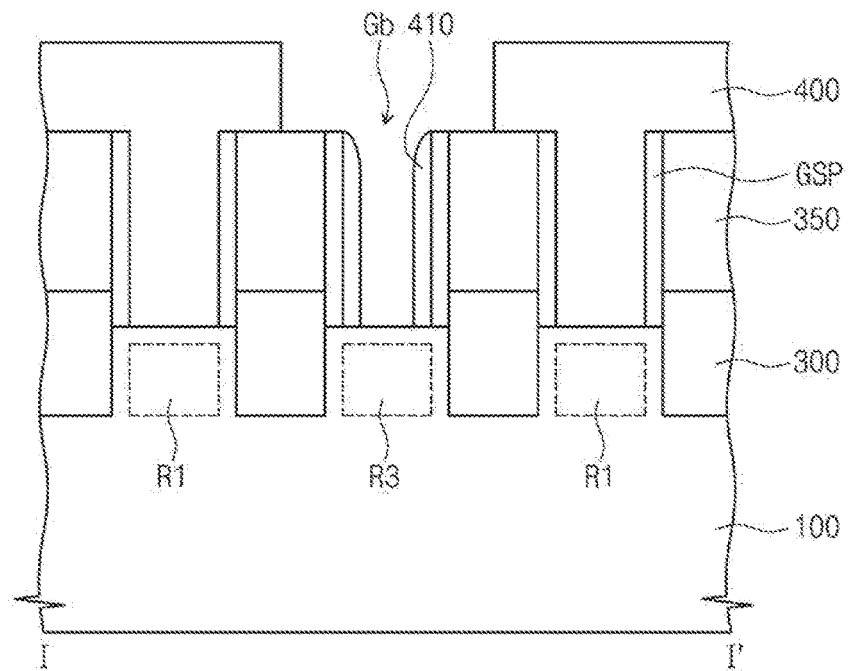
Figure 8C:
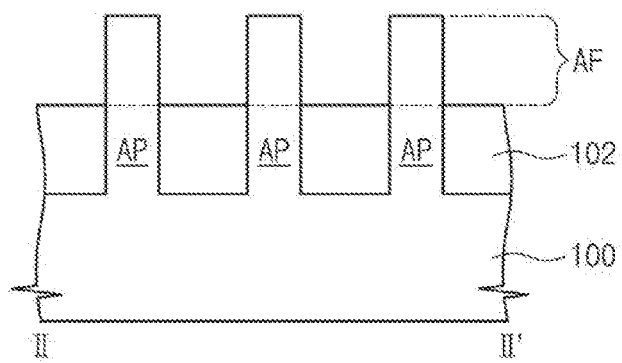
Figure 9A:
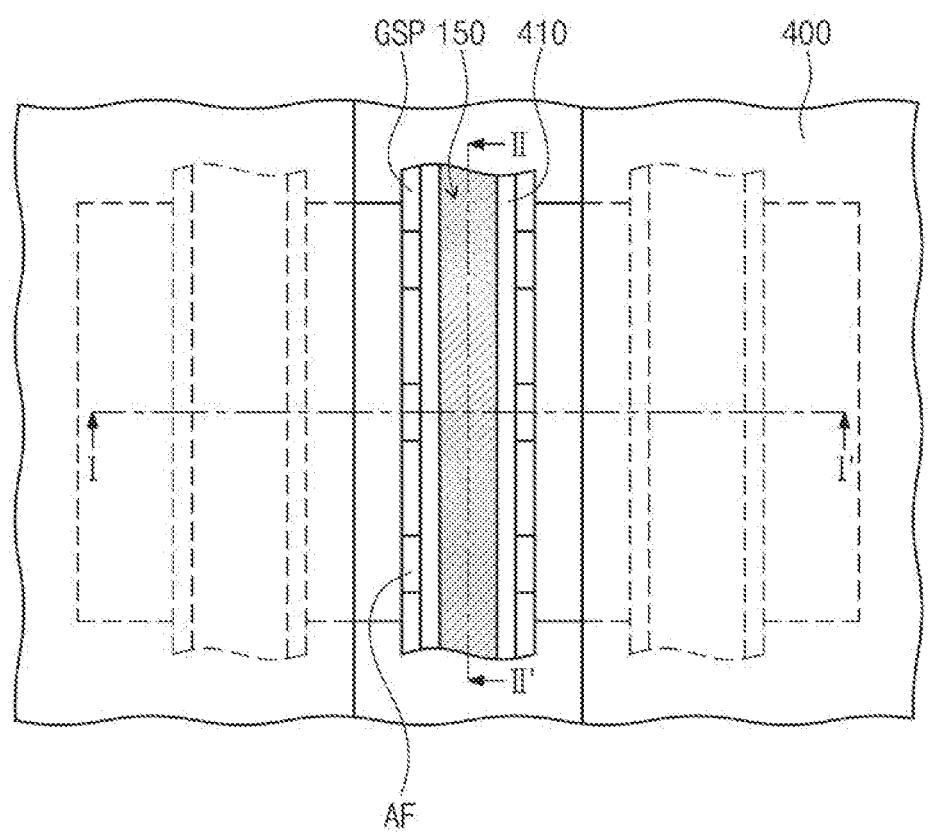
Figure 9B:
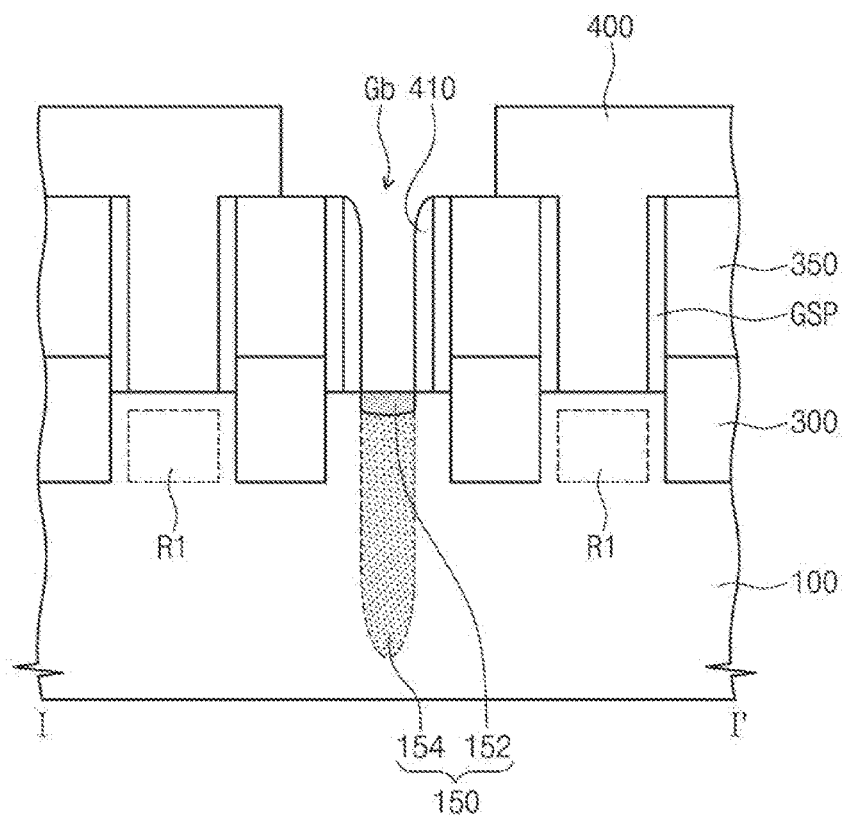
Figure 9C:
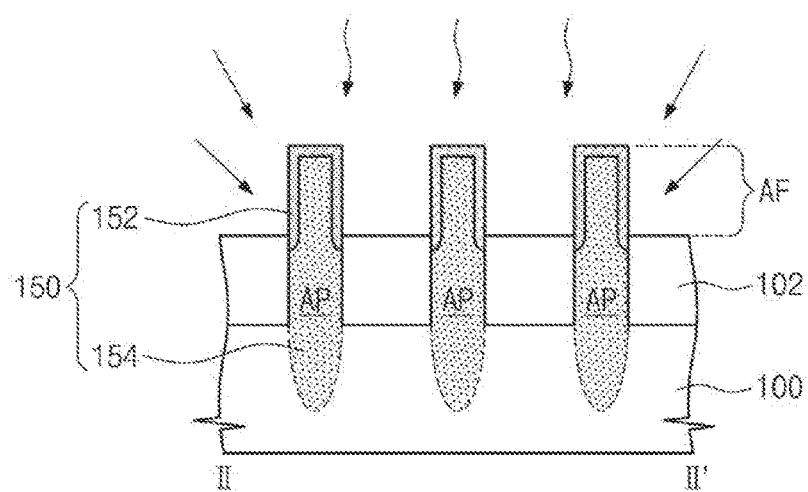

Referring to FIGS. 3A to 3C, a substrate 100 may be patterned to form trenches 101 defining active patterns AP. The substrate 100 may include a bulk silicon substrate, a silicon-on-insulator (SOI) substrate, or a III-V compound semiconductor substrate. Each of the trenches 101 may extend in the first direction X, and be spaced apart from one another in the second direction Y crossing the first direction X. For example, each of trenches 101 may have a length measured in the X direction and a width measured in the Y direction, and adjacent trenches 101 may be distanced from one another in the Y direction. Accordingly, each of the active patterns AP may have a linear shape extending in the first direction X.

Forming the trenches 101 may include forming first mask patterns 110 on the substrate 100, and anisotropically etching the substrate 100 using the mask patterns as an etch mask. The active patterns AP may be defined by forming the trenches 101. The first mask pattern 110 may include a buffer oxide pattern 111 and a hard mask pattern 113, which are sequentially stacked on the substrate 100. The first mask pattern 110 may be removed after forming the trench 101 or forming a device isolation pattern 102 to be described later. According to an embodiment, each of the trenches 101 may be formed to have a downwardly decreasing width, and thus, each of the active patterns AP may be formed to have an upwardly decreasing width. For example, the trenches 101 may have a trapezoidal shape with a width that is narrower at the bottom (e.g., nearer to the substrate 100) and wider at the top (e.g., farther from the substrate 100). The active patterns AP may have widths that become wider as the active patterns AP come nearer to the substrate 100 and smaller as the active patterns AP extend farther away from the substrate 100.

Referring to FIGS. 1 and 4A to 4C, the active fins AF may be formed by forming a device isolation pattern 102 in the trenches 101 (FIG. 2, S10).

Forming the device isolation patterns 102 may include forming a device isolation layer to fill the trenches 101 on the substrate 100, and planarizing and recessing the device isolation layer so as to expose an upper portion of each of the active patterns AP. Recessing each of the device isolation patterns 102 may be performed using, for example, a wet etching process having an etch selectivity with respect to the active patterns AP. The upper portion of the active pattern AP exposed by the device isolation pattern 102 will be used as the active fin AF. In one embodiment, the active fin AF and the active pattern AP may constitute one body without an interface therebetween according to an embodiment. For example, the active fin AF and the active pattern AP may be in material continuity with one another.

Referring to FIGS. 1 and 5A to 5C, sacrificial gate patterns 200 may be formed on the substrate 100 to cross over the active fins AF (FIG. 2, S20).

Forming the sacrificial gate patterns 200 may include forming a etch stop layer on the active fins AF and the device isolation patterns 102, forming a sacrificial gate layer on the etch stop layer, and patterning the sacrificial gate layer. Patterning the sacrificial gate layer may be performed using an etching process having an etch selectivity with respect to the etch stop layer. The sacrificial gate patterns 200 may include a first sacrificial gate pattern 200a, a second sacrificial gate pattern 200b and a third sacrificial gate pattern 200c, which are sequentially formed along the first direction X.

After forming the sacrificial gate patterns 200a, 200b and 200c, the etch stop layer may be etched to form etch stop patterns 210 below the sacrificial gate patterns 200a, 200b and 200c. The etch stop pattern 210 may extend along a bottom surface of each of the sacrificial gate patterns 200a, 200b and 200c and partially cover a top surface of each of the device isolation patterns 102. In some embodiments, the etch stop pattern 210 may cover top and side surface of the active fins AF.

Since the first sacrificial gate pattern 200a is formed to cross over the active fin AF, a channel region R1 and sacrificial regions R2 may be respectively defined in the active fin AF. The channel region R1 may be a portion of the active fin AF that is located below and overlapped by the first sacrificial gate pattern 200a. The sacrificial regions R2 may be other portions of the active fin AF that are located at both sides of the first sacrificial gate pattern 200a and are horizontally separated from each other by the channel region R1. For example, the channel region R1 may be interposed between two sacrificial regions R2.

Similarly, the channel region R1 and sacrificial regions R2 may be also formed below the third sacrificial gate pattern 200c.

A preliminary separation region R3 may be a portion of the active fin AF that is located below and overlapped by the second sacrificial gate pattern 200b, which is interposed between the first and third sacrificial gate patterns 200a and 200c. A separation region 150 to be described later may be formed in the preliminary separation region R3.

Thereafter, gate spacers GSP may be formed on both sidewalls of the sacrificial gate patterns 200 (e.g., on opposing sidewalls of sacrificial gate pattern 200a, on opposing sidewalls of sacrificial gate pattern 200b, and on opposing sidewalls of sacrificial gate pattern 200c). For example, the gate spacers GSP may include silicon nitride (SiN). Forming the gate spacers GSP may include forming a gate spacer layer on the substrate 100, and then, performing an anisotropic etching process to form the gate spacers GSP. The gate spacer layer may be formed by, for example, a chemical vapor deposition process.

Referring to FIGS. 1, 6A to 6C, source/drain regions 300 may be formed at both sides of the sacrificial gate patterns 200 (FIG. 2, S30). The source/drain regions 300 may be formed at the sacrificial regions R2 of the active fin AF. Forming the source/drain regions 300 may include etching the sacrificial regions R2 located at both sides of the sacrificial gate patterns 200, and then, performing an epitaxial process on the substrate 100. The source/drain regions 300 may include at least one of, for example, silicon germanium (SiGe), silicon (Si), and silicon carbide (SiC), which are epitaxially grown on the substrate 100. In example embodiments where the semiconductor device is a CMOS type of device, a first epitaxial layer for serving as source/drain electrodes of NMSFETs and a second epitaxial layer for serving as source/drain electrodes of PMOSFETs may be formed on the substrate 100. The first epitaxial layer may be formed of a material capable of exerting a tensile stress on the channel regions of NMSFETs, and the second epitaxial layer may be formed of a material capable of exerting a compressive stress on the channel regions of PMOSFETs. The first and second epitaxial layers may be formed of silicon carbide (SiC) and silicon germanium (SiGe), respectively, but the concepts may not be limited thereto. During or after the epitaxial process, the source/drain regions 300 may be doped with impurities. Although not shown, the source/drain regions 300 may include a plurality of epitaxial layers.

Referring to FIGS. 1 and 7A to 7C, a lower interlayer insulating layer 350 may be formed on the resultant structure including the source/drain regions 300. The lower interlayer insulating layer 350 may be formed to cover the source/drain regions 300 and the first, second, and third sacrificial gate patterns 200a, 200b, and 200c. The lower interlayer insulating layer 350 may include at least one of a silicon oxide layer, a silicon nitride layer, a silicon oxynitride layer or a low-k dielectric layer. The lower interlayer insulating layer 350 may be etched to expose the top surface of each of the sacrificial gate patterns 200. Subsequently, the first, second, and third sacrificial gate patterns 200a, 200b, and 200c may be removed. Accordingly, gap regions Ga, Gb, and Gc may be formed between the gate spacers GSP to expose the active fins AF (FIG. 2, S40). For example, the first, second and third sacrificial gate patterns 200a, 200b, and 200c may be removed to form the first, second, and third gap regions Ga, Gb, and Gc, respectively.

Forming gap regions Ga, Gb, and Gc may include performing an etching process having an etch selectivity with respect to the gate spacers GSP and the lower interlayer insulating layer 350 to etch the sacrificial gate patterns 200. In addition, forming the gap regions Ga, Gb, and Gc may include removing the etch stop pattern 210 to expose the active fin AF and portions of the top surface of each of the device isolation patterns 102.

Referring to FIGS. 1 and 8A to 8C, a second mask pattern 400 may be formed to open the second gap region Gb, and then, a barrier spacer 410 may be formed (FIG. 2, S52).

In more detail, the second mask pattern 400 may be formed to cover the first and third gap regions Ga and Gc and to open the second gap region Gb. The second mask pattern 400 may include a spin on hard (SOH) mask layer. Subsequently, a barrier layer (not shown) may be formed on the second mask pattern 400 and in the second gap region Gb opened by the second mask pattern 400. The barrier layer may be anisotropically etched to form the barrier spacer 410. The barrier spacer 410 may include, for example, silicon nitride (SiN) or silicon oxide ($SiO_2$).

Referring to FIGS. 1, and 9A to 9C, a separation region 150 may be formed in the active fin AF exposed by barrier spacer 410 (FIG. 2, S50). In addition, due to the presence of the barrier spacer 410, the separation region 150 formed in the substrate 100 may be spaced apart from the adjacent ones of source/drain regions 300. For example, the separation region 150 formed in the substrate 100 may be interposed between and spaced apart from adjacent source/drain regions 300.

First, an oxidation process may be performed on the active fin AF exposed by the barrier spacer 410 in order to form an oxide layer 152 (FIG. 2, S54). For example, an oxide layer 152 may be formed on the substrate 100 using a thermal oxidation process. Oxygen atoms provided by the thermal oxidation process may be provided in the active fin AF exposed by the second gap region Gb. During the oxidation process, at least portions of the active fin AF and the substrate below the active fin AF may be oxidized to form the oxide layer 152. For example, the oxide layer 152 may be formed in a surface of the active fin AF. During the oxidation process, the source/drain regions 300 adjacent to the active fin AF may be protected from oxidation by the barrier spacer 410.

An impurity region 154 may be formed in the substrate 100 by performing an ion implantation process using the barrier spacer 410 as an ion implantation mask. The impurity region 154 may be formed by a tilted ion implantation process. As an example, the impurity region 154 may be doped with impurities of a different conductivity type from those in the source/drain regions 300. For example, when the source/drain region 300 includes an n-type impurity, the impurity region 154 may include a p-type impurity, and when the source/drain region 300 includes a p-type impurity, the impurity region 154 may include an n-type impurity. The impurity region 154 may be formed in the oxide layer and toward an interior region of the substrate 100. A level of a lowermost surface of the impurity region 154 may be lower than a level of a lowermost surface of the source/drain regions 300.

Referring back to FIGS. 1A to 1C and 2, the gap regions Ga, Gb and Gc may be filled to form the gate dielectric pattern GI and the gate electrode GE (FIG. 2, S60).

After removing the second mask pattern 400, the gate dielectric layer may be formed on the substrate 100 to partially fill the gap regions Ga, Gb and Gc. The gate dielectric layer may be formed to cover the active fin AF. The gate dielectric layer may include at least one of high-k dielectric materials. For example, the gate dielectric layer may include at least one of hafnium oxide, hafnium silicate, zirconium oxide or zirconium silicate, but the inventive concepts are not limited thereto. The gate dielectric layer may be formed by, for example, an atomic layer deposition (ALD) process. The gate layer may be formed on the gate dielectric layer to fill the remaining space of each of the gap regions Ga, Gb and Gc. The gate layer may include at least one of conductive metal nitrides (e.g., titanium nitride or tantalum nitride) and metals (e.g., aluminum or tungsten). In some embodiments, the gate layer may be connected to a voltage source to allow for biasing.

A planarization process may be performed on the gate dielectric layer and the gate layer which are sequentially stacked on the substrate 100, and thus, the gate dielectric pattern GI and the gate electrode GE may be formed. The planarization process may be performed to expose the top surface of the lower interlayer insulating layer 350 and the top surfaces of the gate spacers GSP. The gate dielectric pattern GI may extend along a bottom surface of the gate electrode GE. The gate dielectric pattern GI may be formed on sidewalls of the gate electrode GE and may be interposed between the gate electrode GE and the gate spacer GSP. In the case where the semiconductor device according to an example embodiment is a CMOS type of device, forming the gate electrode GE may include separately forming gate electrodes for NMOSFET and PMOSFET, but the inventive concepts are not limited thereto.

Referring to FIGS. 1A to 1C, the separation region 150 may be formed between the first transistor TR1 and the second transistor TR2 which are adjacent to each other. The dummy gate structure DGS may be formed on the separation region 150. For example, the separation region 150 may be interposed between the first transistor TR1 and the second transistor TR2 along the same active fin AF.

An upper interlayer insulating layer may be formed on the resultant structure including the gate structures GS. Contact holes may penetrate the upper interlayer insulating layer and the lower interlayer insulating layer 350 and thereby exposing the source/drain regions 300. Contact plugs may be formed to fill the contact holes. Interconnection lines may be formed on the upper interlayer insulating layer to be connected to at least one of the contact plugs. The interconnection lines may be connected to the source/drain regions 300 through the contact plugs.

According to example embodiments, the separation region 150 may be formed between the transistors to electrically separate the transistors from each other. For example, the separation region 150 may be interposed between adjacent transistors, electrically isolating the adjacent transistors from one another.

Figure 10A:
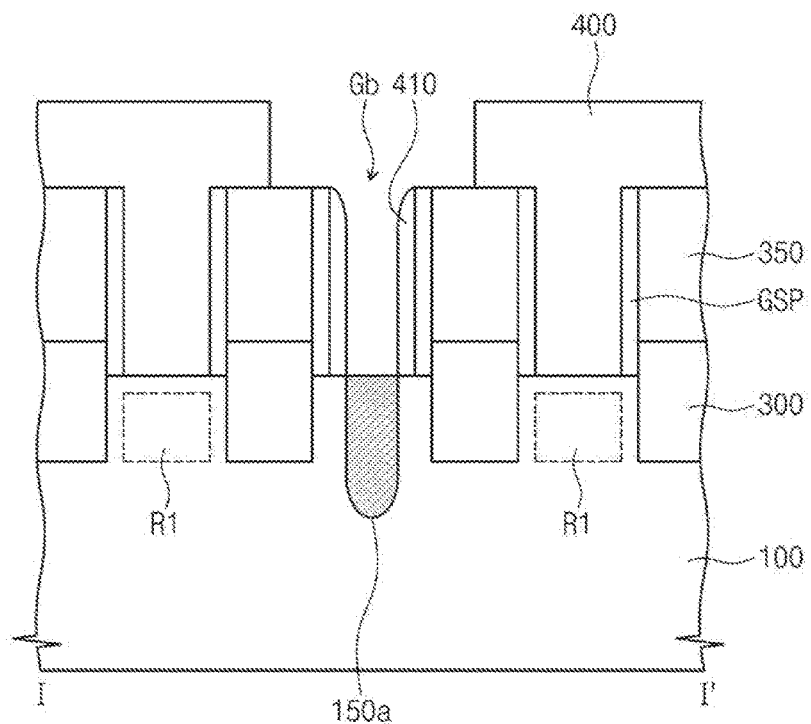
FIGS. 10A and 10B are cross-sectional views, taken respectively along lines I-I' and II-II' of FIG. 9A, illustrating a method of forming a separation region for a semiconductor device according to example embodiments.
Figure 10B:
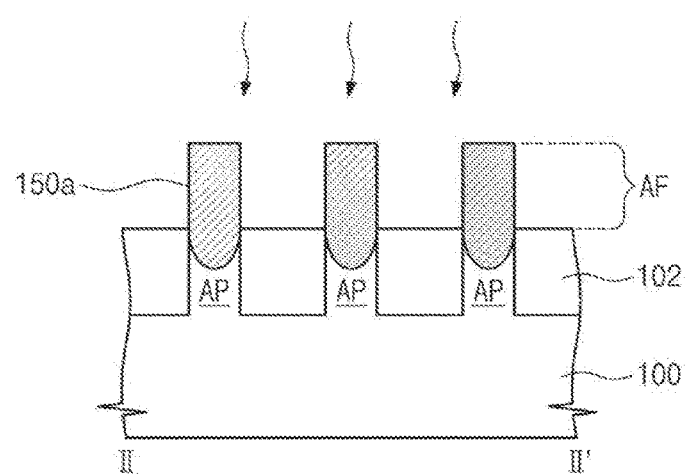
Figure 11A:
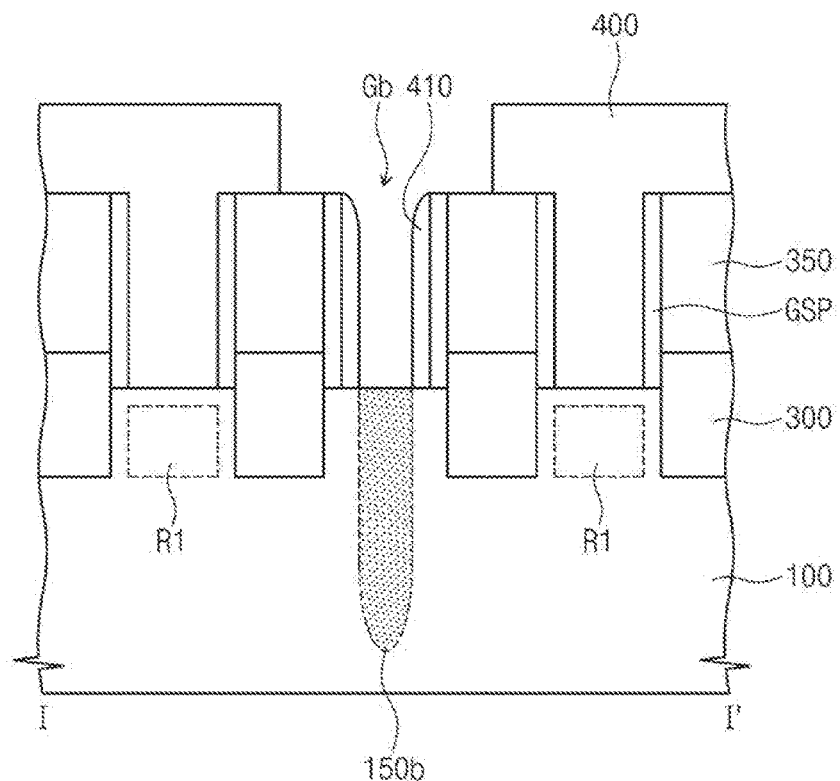
FIGS. 11A and 11B are cross-sectional views, taken respectively along lines I-I' and II-II' of FIG. 9A, illustrating a method of forming a separation region for a semiconductor device according to example embodiments.
Figure 11B:
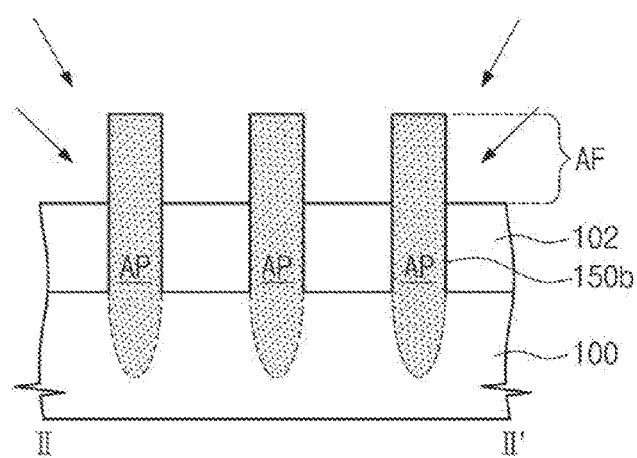

FIGS. 10A and 10B are cross-sectional views illustrating a method of forming a separation region 150*a* according to example embodiments. FIGS. 11A and 11B are cross-sectional views illustrating a method of forming a separation region 150*b* according to example embodiments. FIGS. 10A and 10B are cross-sectional views taken along lines I-I' and II-II' of FIG. 9A, respectively. FIGS. 11A and 11B are cross-sectional views taken along lines I-I' and II-II' of FIG. 9A, respectively.

Referring to FIGS. 3A to 9A, 3B to 9B, and 3C to 9C, the separation region 150, which is formed using the oxidation process and the ion implantation process, have been described. However, in the embodiment of FIGS. 10A and 10B, a separation region 150*a* may be formed using only an oxidation process without the ion implantation process. The oxide layer may be formed in a surface of the active fin AF. However, when a width of the active fin AF is fine or narrow, the oxide layer may be formed in a whole interior of the active fin AF. The oxide layer may be served as a separation region 150*a*. Also, in the embodiment of FIGS. 11A and 11B, a separation region 150*b* may be formed using only ion implantation process without the oxidation process.

While aspects of the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative.

What is claimed is:

1. A method of fabricating a semiconductor device, the method comprising:
    patterning a substrate to form an active fin;
    forming a sacrificial gate pattern crossing over the active fin on the substrate;
    forming a gate spacer on a sidewall of the sacrificial gate pattern;
    removing the sacrificial gate pattern to form a gap region exposing the active fin;
    forming a barrier spacer on an inner sidewall of the gate spacer after removing the sacrificial gate pattern; and
    forming a separation region in the active fin exposed by the gap region,
    wherein forming the separation region comprises forming an oxide layer in the exposed active fin and forming an impurity region with impurities implanted into the exposed active fin.

2. The method of claim 1,
    wherein forming the impurity region comprises performing an ion implantation process using the barrier spacer as an ion implantation mask.

3. The method of claim 2, wherein the active fin comprises a first region and a second region, the first region being disposed below the sacrificial gate pattern and the second region being disposed at both sides of the sacrificial gate pattern, the method further comprising etching the second region of the active fin and forming source/drain regions at the both sides of the sacrificial gate pattern.

4. The method of claim 3, wherein a level of a lowermost surface of the separation region is lower than a level of a lowermost surface of the source/drain regions.

5. The method of claim 3, wherein forming the source/drain regions comprises growing an epitaxial layer on the substrate.

6. The method of claim 2, wherein the barrier spacer comprises silicon nitride or silicon oxide.

7. The method of claim 1, wherein forming the separation region comprises forming the impurity region below the oxide layer after forming the oxide layer in a surface of the exposed active fin.

8. The method of claim 1, further comprising:
    forming a gate pattern filling the gap region after forming the separation region.

9. The method of claim 8, wherein the gate pattern corresponds to a dummy gate pattern.

10. The method of claim 1, wherein the sacrificial gate pattern is a plurality of sacrificial gate patterns and the gap region is a plurality of gap regions, the method further comprising:
    disposing the active fin extending in a first direction on the substrate;
    providing a plurality of second sacrificial gate patterns extending in a second direction perpendicular to the first direction on the substrate and being spaced apart from one another;
    removing the plurality of second sacrificial gate patterns to form a plurality of second gap regions; and
    forming a plurality of gate patterns to respectively fill the plurality of second gap regions,
    wherein second separation regions are formed only below some of the plurality of second gap regions, and are not formed below the others thereof.

11. The method of claim 10, wherein a first portion of the plurality of second sacrificial gate patterns formed in some of the plurality of second gap regions correspond to dummy gate patterns, and a second portion of the plurality of second sacrificial gate patterns formed in the others thereof correspond to active gate patterns.

12. A method of fabricating a semiconductor device, the method comprising:
    forming an active fin extending in a first direction on a substrate;
    forming a first sacrificial gate pattern, a second sacrificial gate pattern and a third sacrificial gate pattern covering the active fin and being spaced apart from one another in a second direction perpendicular to the first direction on the substrate;
    removing the first, second and third sacrificial gate patterns to form a first gap region, a second gap region and a third gap region exposing portions of the active fin;
    forming an oxide layer in only a portion of the active fin that is exposed by the second gap region, wherein the second gap region is disposed between the first and third gap regions; and
    forming a first gate pattern, a second gate pattern and a third gate pattern filling the first, second and third gap regions, respectively,
    wherein the first and third gate patterns correspond to active gate patterns and the second gate pattern corresponds to a dummy gate pattern.

13. The method of claim 12, further comprising:
    forming gate spacers on sidewalls of each of the first, second and third sacrificial gate patterns;
    removing the first, second and third sacrificial gate patterns to form the first, second and third gap regions, respectively;
    forming a mask pattern opening the second gap region;
    forming a barrier spacer on an inner sidewall of the gate spacer exposed by the second gap region; and
    forming an impurity region through ion implantation using the barrier spacer as a mask.

14. The method of claim 13, wherein the impurity region is formed in or below the oxide layer after the oxide layer is formed on a surface of the active fin exposed by the second gap region.

15. A method of fabricating a semiconductor device, the method comprising:
    patterning a substrate to form an active fin that protrudes from a surface of the substrate;
    forming a first sacrificial gate pattern, a second sacrificial gate pattern and a third sacrificial gate pattern covering the active fin and being spaced apart from one another;
    removing the first, second and third sacrificial gate patterns to form a first gap region, a second gap region and a third gap region exposing portions of the active fin; and
    forming an isolation region in a portion of the active fin exposed by the second gap region, wherein forming the isolation region comprises forming an oxide layer in the portion of the active fin exposed by the second gap region;
    forming gate spacers on sidewall of each of the first, second, and third sacrificial gate patterns; and
    removing the first, second, and third sacrificial gate patterns to form the first, second, and third gap regions, respectively;
    forming a mask pattern opening the second gap region;
    forming a barrier spacer on an inner sidewall of the gate spacer exposed by the second gap region; and
    forming an impurity region in the portion of the active fin exposed by the second gap region through ion implantation using the barrier spacer as a mask.

16. The method of claim 15, wherein the impurity region is formed in or below the oxide layer after the oxide layer is formed on a surface of the active fin exposed by the second gap region.

17. The method of claim 15, further comprising:
forming a first gate pattern, a second gate pattern and a third gate pattern filling the first, second and third gap regions, respectively,
wherein the first and third gate patterns correspond to active gate patterns and the second gate pattern corresponds to a dummy gate pattern.

18. The method of claim 15, wherein the second gap region is disposed between the first gap region and the third gap region.

* * * * *